United States Patent [19]

Cox

[11] Patent Number: 4,922,195
[45] Date of Patent: May 1, 1990

[54] EXTRANEOUS FREQUENCY DETECTOR

[75] Inventor: Roger W. Cox, Monroeville, Pa.

[73] Assignee: Westinghouse Electric Corp., Pittsburgh, Pa.

[21] Appl. No.: 286,391

[22] Filed: Dec. 19, 1988

[51] Int. Cl.⁵ .......................................... G01R 23/165
[52] U.S. Cl. ........................... 324/158 MG; 324/79 D
[58] Field of Search .......... 324/158 MG, 79 D, 79 R; 340/648; 328/307; 318/490; 322/99; 455/307; 375/96, 103; 364/483; 333/173

[56] References Cited

U.S. PATENT DOCUMENTS

| | | | |
|---|---|---|---|
| 4,197,515 | 4/1980 | Hörnfeldt et al. | 333/173 |
| 4,313,096 | 1/1982 | Fleischer | 333/173 |
| 4,326,261 | 4/1982 | Peoples | 324 78 D/78 D |
| 4,471,299 | 9/1984 | Elmis | 324/79 D |
| 4,794,369 | 12/1988 | Haferd | 324/142 |
| 4,803,650 | 2/1989 | Nashimura et al. | 333/173 |

OTHER PUBLICATIONS

Ted W. Pickerrell, Designing Low Frequency Filters on the CMOS Monochip, 1983, Monochip Application Note APN-28, Interdesign, a Ferranti Company.

Primary Examiner—Ernest F. Karlsen
Assistant Examiner—Edward Urban

[57] ABSTRACT

An extraneous frequency detector especially suited for analyzing the three-phase output of a variable speed constant frequency (VSCF) generator generates in a sample-and-hold circuit amplitude samples of a phase selected by a multiplexer for application to a discrete time analog filter in the form of a switched capacitor high pass filter. A control circuit generates dual-phase non-overlapping clocking signals which control the sampling rate of the sample-and-hole circuit and the switching rate of the switched capacitor filter. Two modes of operation are provided for the single filter circuit by generating the clocking signals for the first mode of operation at a first frequency which is at least twice the frequency of the highest order harmonic of interest such that all frequencies above the fundamental are detected. In the second mode of operation, the clocking signals are generated at the fundamental frequency. This produces aliasing of the fundamental frequency and all harmonics resulting in a comb filter which detects all frequencies above a few hertz except for the fundamental and its harmonics. The selected frequency is preferably a power of two multiple of the fundamental frequency such that a divider circuit generates the clocking signals at fundamental frequency from the pulses at the selected high frequency. A peak detector provides an output signal representative of the highest amplitude of the frequencies passed by the filter.

14 Claims, 7 Drawing Sheets

EXTRANEOUS FREQUENCY DETECTOR

BACKGROUND INFORMATION

1. Field of the Invention

This invention relates to circuits for detecting frequencies other than a selected fundamental frequency in an ac electrical signal. More particularly, it is directed to such detectors utilizing discrete time analog filters which can be switched at high frequency to operate as a HIGHPASS filter to detect frequencies above the fundamental frequency or switched at the fundamental frequency to alias the fundamental and its harmonics to detect the presence of other frequencies. The circuits have particular application in detecting extraneous frequencies in variable speed constant frequency (VSCF) generators.

2. Background Information

In certain applications it is desirable to detect frequencies in an ac signal other than the fundamental frequency. One such application is the solid state variable speed constant frequency (VSCF) generators used, for instance, in airborne power systems. Such VSCF generators utilize solid sate inverters to synthesize an ac signal, usually from square wave pulses. The ac signals generated by such devices typically have a sizable harmonic content, especially the odd harmonics. It is common to filter the synthesized ac signals to reduce this harmonic content. Until recently, specifications have called for means for detecting frequencies above fundamental in the filtered ac power signal. The presence of harmonic noise in the filtered ac signal could indicate a failure within the filter. Non-harmonic noise is possibly an indication of a failure in the generator or of drift in the frequency of the generator. Currently, high pass filters composed of discrete components are used to detect frequencies above the fundamental. A number of components are required to achieve a suitable corner frequency in the response characteristic above the fundamental frequency.

Specifications have recently been modified to require detection of frequencies in the ac output of VSCF generators below as well as above the fundamental frequency. This could be achieved by providing a low pass filter which passes frequencies below the fundamental frequency in addition to the high pass filter, although this would add to the complexity, size, weight and cost of the system, all of which are factors to be minimized in an airborne system.

There is need therefore for an improved apparatus for detecting frequencies both above and below the fundamental frequency in an ac signal.

There is also a need for such an apparatus which minimizes size, weight, complexity and cost.

There is a further need for such an apparatus which can be implemented by an integrated circuit.

SUMMARY

These and other objects are realized by the invention which is directed to apparatus for detecting extraneous frequencies in an electrical signal with a preset fundamental frequency, and especially such electrical signals generated by a variable speed constant frequency (VSCF) electrical power generator. The apparatus includes sample-and-hold means for sampling the amplitude of the electrical signal at a selected sampling rate. The amplitude samples are applied to a discrete time analog highpass filter, and in particular, a switched capacitor highpass filter. The rate of sampling of the sample-and hold circuit and the rate of switching in the switched capacitor highpass filter are controlled by control means which generates clocking signals. In particular, the sample-and-hold circuit is a two-stage circuit and the switched capacitor filter contains two sets of switches which are controlled by dual-phase non-overlapping clocking signals.

The apparatus may be operated in two modes. In a comb mode, the control means generates the clocking signals at the preset fundamental frequency of the electrical signal being analyzed. This causes aliasing of the fundamental frequency and its harmonics which appear as dc levels and are eliminated by the highpass switched capacitor filter. In the second mode of operation, the control means generates the clocking signals at a frequency which is at least twice the highest order harmonic to be detected. This selected frequency is a multiple of the fundamental frequency, and preferably a power of 2 multiple such that the selected clocking frequency can be divided down by conventional digital techniques to the fundamental frequency for the comb mode of operation.

The relative values of the capacitors in the switched capacitor highpass filter are selected to pass frequencies above the fundamental frequency when operating in the highpass mode. Dividing down the frequency of the clocking signals also reduces the frequencies passed by the filter by the same factor. Thus, in the exemplary system in which a clocking frequency of 51.2 KHz is used for the highpass filter mode and in which the values of the filter capacitors are selected to pass frequencies above 400 Hz (with a corner frequency of about 800 Hz), dividing down the 51.2 KHz clocking signals by 128 to produce 400 KHz clocking signals results in frequencies above 3.125 Hz (with a corner frequency of about 6.5 Hz) except for the fundamental and its harmonics, being passed in the comb mode of operation. Thus, the filter detects extraneous frequencies all the way down to just a few hertz when operating in the comb mode.

The switched capacitor highpass filter is preferably comprised of cascaded two-pole stages and in the best mode comprises cascaded second order, fourth order and six order two-pole filter stages.

The extraneous frequency detector of the invention is an economical means of combining a highpass filter which can be used to detect harmonics in the electrical signal, with a comb filter which detects all extraneous frequencies, even those below the fundamental. The detector is preferably implemented on a single semi-custom integrated circuit chip.

For analysis of a multiphase electrical signal, a multiplexer selectively applies the desired phase to the sample-and-hold circuit. In a preferred embodiment, an output circuit generates a discrete time signal representative of the amplitude of the frequencies passed by the switched capacitor highpass filter, and a signal representative of the peak value of the filter output.

BRIEF DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENT

Figure 1:
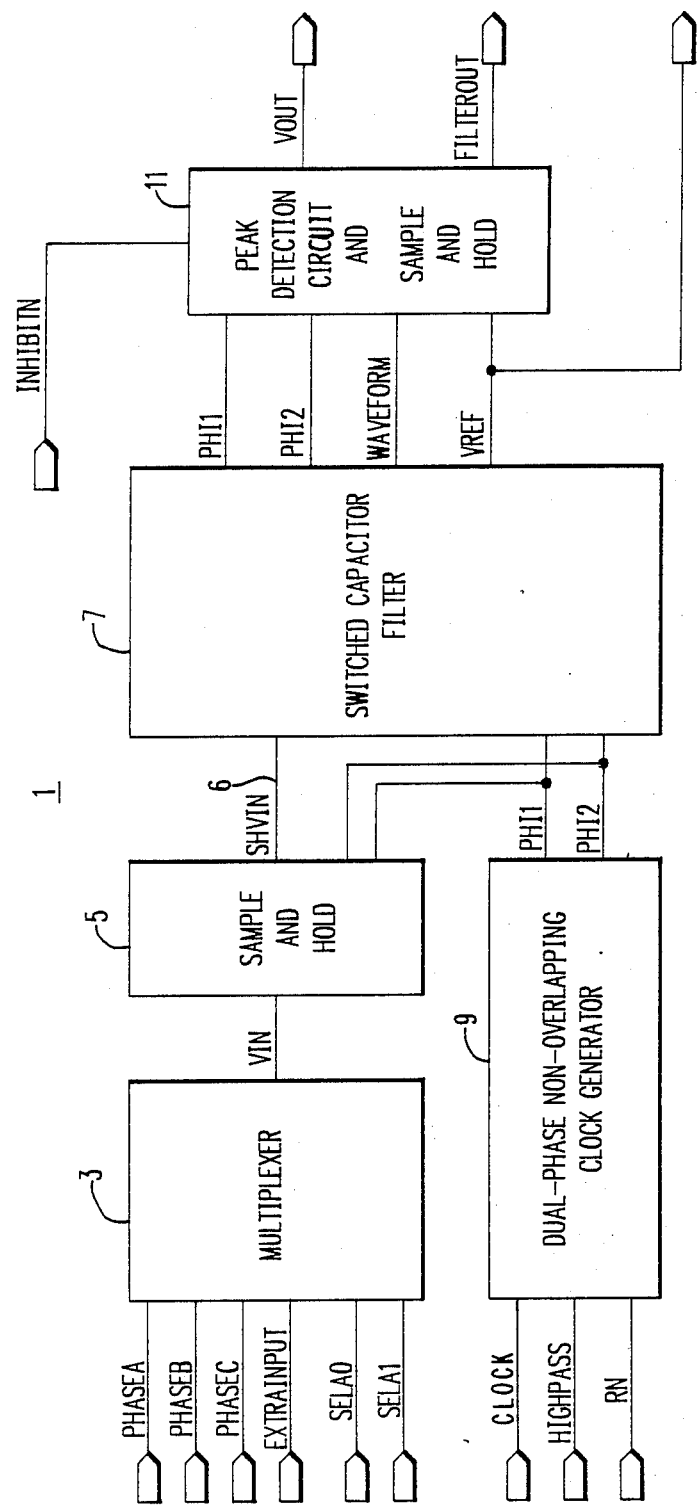
FIG. 1 is a schematic circuit diagram in block form of an extraneous frequency detector in accordance with the invention.

FIG. 1 illustrates in block diagram form an extraneous frequency detector 1 in accordance with the invention. The exemplary detector 1 is designed for use in detecting frequencies other than the fundamental frequency in a three-phase 400 Hz electrical signal generated by a variable speed constant frequency (VSCF) generator (not shown). Such a VSCF generator typically has a filter (also not shown) designed to reduce the harmonic content inherent in the generator output. The present invention is employed to detect extraneous frequencies in the filtered three-phase ac signal generated by such a system. It will be apparent to those skilled in the art that the invention has application to detecting frequencies other than the fundamental in other electrical systems whether single phase or multiphase.

The detector 1 includes a multiplexer 3 which selects one of the phases A, B or C of the three-phase ac signal generated by the VSCF generator, or an extra signal such as a test signal, in response to a two bit binary signal comprising the signals SELA0 and SELA1. The selected signal, VIN, is applied to a sample-and-hold circuit 5, which it will be seen, is a two stage device. This sample-and-hold circuit 5 samples the instantaneous value of the selected input signal and stores that value as an amplitude sample until the next sample is taken. The stored amplitude sample, SHVIN, is applied over a lead 6 to a discrete time analog filter 7, comprising a switched capacitor filter. As discussed in detail below, the exemplary switched capacitor filter 7 is a sixth order highpass filter which may be operated in two modes.

The sampling rate of the sample-and-hold circuit and the switching of the switched capacitor filter 7 are controlled by control means in the form of a dual-phase, non-overlapping clock generator 9. The clock generator 9 generates two non-overlapping clocking signals PHI1 and PHI2 from CLOCK pulses received from an external crystal oscillator (not shown). The clock generator 9 generates the signals PHI1 and PHI2 at two rates for the two modes of operation of the filter, fundamental frequency (400 Hz) and 51.2 KHz, in response to a HIGHPASS signal. An RN signal resets the clock generator 9 for test.

The output signal WAVEFORM produced by the switched capacitor filter 7 is applied to a peak detection and sample-and-hold circuit 11. The PHI1 and PHI2 clock signals from the CLOCK generator 9 are also passed on by the switched capacitor filter circuit 7 to the peak detection and sample-and-hold circuit 11 together with a VREF. VREF is also provided as an output from the extraneous frequency detector 1. An INHIBITN signal resets the peak detection portion of the circuit 11.

The peak detection and sample-and-hold circuit 11 generates two output signals. FILTEROUT is the discrete time output of the switched-capacitor filter circuit 7 and VOUT is a signal representative of the peak amplitude of all extraneous frequencies in the selected phase of the VSCF generator output. These output signals may be used by other systems (not shown), for instance, to generate an alarm or even to disconnect the generator should unacceptable levels of extraneous frequencies be detected by the detector of the invention.

Figure 2:
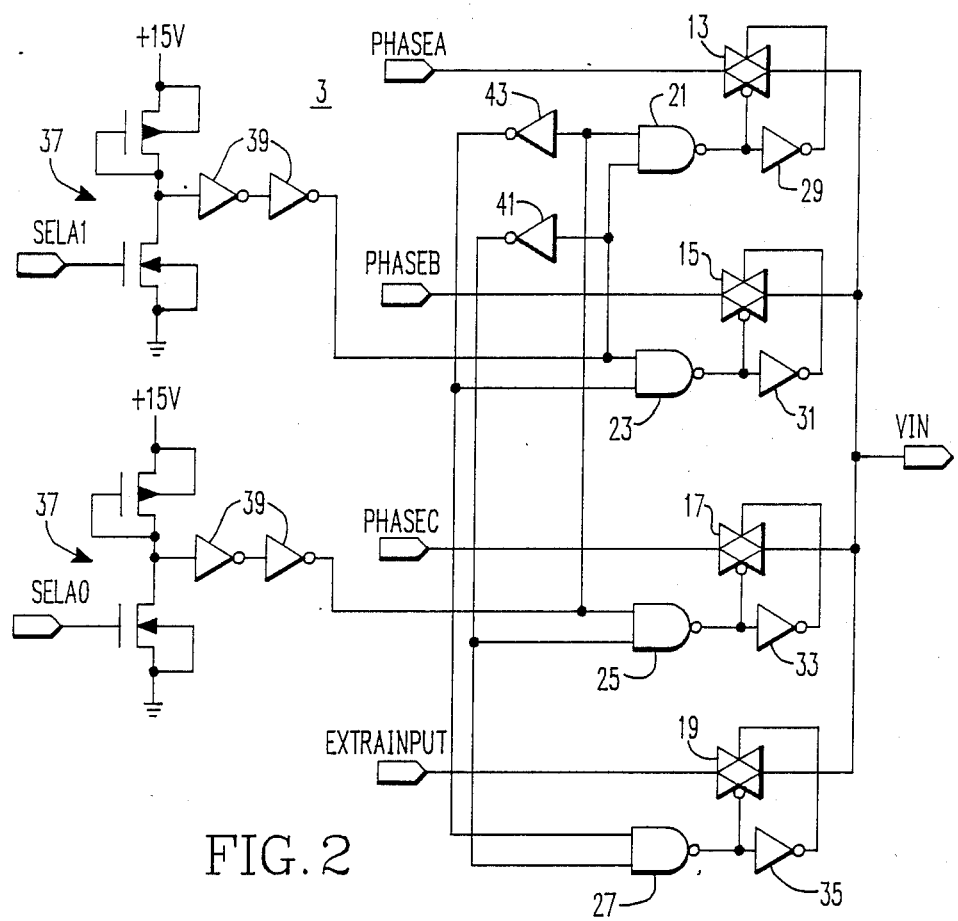
FIG. 2 is a schematic circuit diagram of a multiplexer which forms part of the detector of FIG. 1.

The details of the multiplexer 3 are illustrated in FIG. 2. The PHASEA, PHASEB, PHASEC and EXTRA INPUT signals are each applied to a CMOS transmission gate 13, 15, 17 and 19 each of which is controlled by a NAND gate 21, 23 and 25 and 27 respectively. Inverters 29, 31, 33 and 35 provide the complimentary signals required to operate the CMOS transmission gates 13, 15, 17 and 19 respectively.

The NAND gates 21, 23, 25 and 27 are controlled in turn by the signals SELA1 and SELA0. These two 5 volt digital signals are converted to 15 volt signals by level shifters 37 and passed through pulse shapers comprising series connected inverters 39. The conditioned signal SELA1 is applied directly to NAND gates 21 and 23 and through inverter 41 to NAND gates 25 and 27. On the other hand, SELA0 is applied directly to NAND gates 21 and 25, and through an inverter 43 to NAND gates 23 and 27. Through appropriate selection of the digital values of the signals SELA1 and SELA0 only a selected one of the transmission gates 13, 15, 17 and 19 is turned on to select the appropriate one of the phases of the filtered generator signal or the extra input as VIN.

Figure 3:
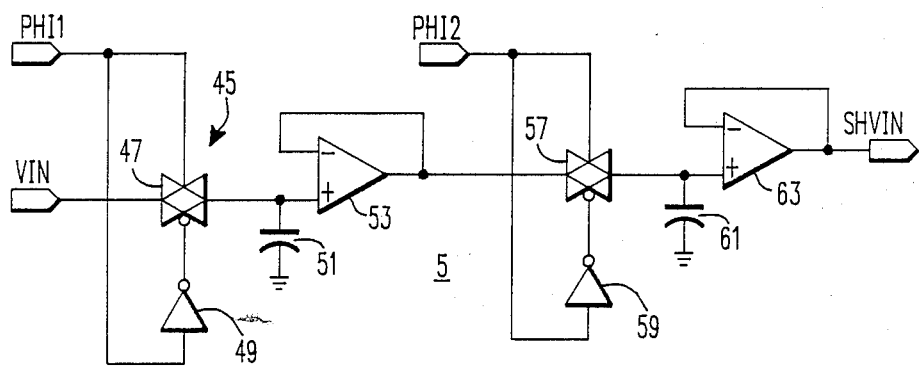
FIG. 3 is a schematic circuit diagram of a sample-and-hold circuit which forms a part of the detector of FIG. 1.
Figure 4:
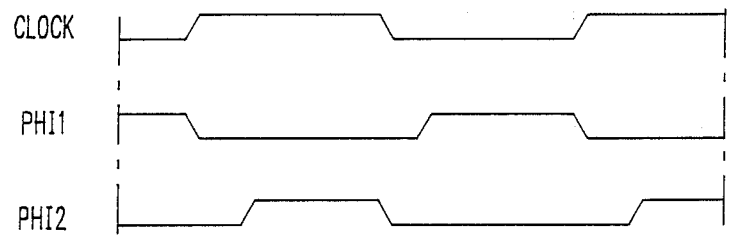
FIG. 4 is a waveform diagram of non-overlapping clock signals used by the detector of FIG. 1.

FIG. 3 illustrates the dual stage sample-and-hold circuit 5. This conventional sample-and-hold circuit includes a first stage 45 comprising CMOS transmission gate 47 with its inverter 49, capacitor 51 and buffer amplifier 53. The series connected second stage 55 includes CMOS transmission gate 57 with its inverter 59, capacitor 61 and buffer amplifier 63. The first stage transmission gate 47 is controlled by clocking signal PHI1, while transmission gate 57 of the second stage is controlled by the clock signal PHI2. As shown in FIG. 4, the signals PHI1 and PHI2 are complimentary, but non-overlapping, to assure that only one gate at a time is turned on. With PHI1 high, the first stage 45 samples and stores the instantaneous amplitude of the applied signal VIN, while the second stage maintains its previously stored value because PHI2 is low to turn gate 57 off. When PHI2 goes high after PHI1 has gone low, the amplitude sample in the first stage 45 is shifted to the second stage 55. As will be seen, this two stage sample-and-hold circuit provides stable analog signals for the discrete time filter circuit 7.

Figure 5:
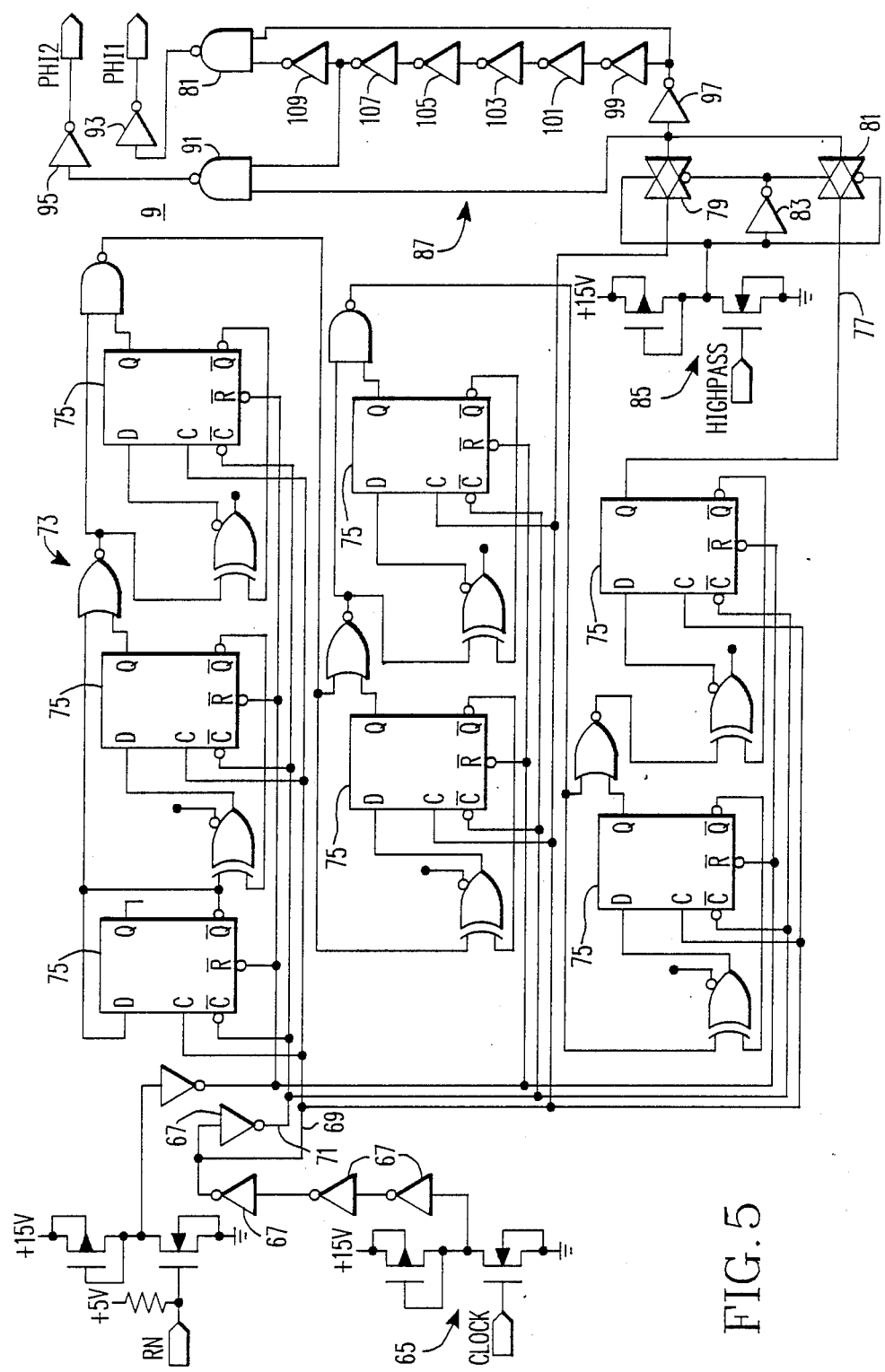
FIG. 5 is a schematic circuit diagram of a clock generator and divider which forms a part of the detector of FIG. 1.

Details of the dual-phase non-overlapping clock generator circuit 9 are illustrated in FIG. 5. The pulse signal CLOCK generated by an external crystal oscillator is applied to the clock generator circuit 9 through level shifter 65 which converts the CLOCK signal to an inverted 15 volt CLOCK signal. This later signal is passed through a series of inverters 67 to generate a 15 volt clock signal on lead 69 and an inverted clock signal on lead 71. These signals are applied to a divider circuit 73 comprising a series of 7 flip-flops 75. This divider circuit 73 divides the 51.2 KHz input CLOCK signal by 128 to produce on lead 77 a 400 Hz clock signal. The 51.2 KHz signal on lead 69 and the 400 Hz signal on lead 77 are applied to complimentary transmission gates 79 and 81 respectively for which inverter 83 provides the complimentary control signals. These transmission gates are oppositely controlled by a HIGHPASS signal which is applied to the control inputs of the transmission gates 79 and 81 through level shifter 85. With the HIGHPASS signal high, transmission gate 79 is turned on to pass the 51.2 KHz signal on lead 69 to a non-overlapping signal generator 87. With the HIGHPASS signal low, the 400 Hz signal is selected.

The non-overlapping signal generator 87 is a conventional circuit having a pair of NAND gates 89 and 91 which generate through inverters 93 and 95 respectively the dual-phase non-overlapping clocking signals PHI1 and PHI2. The signal selected by the gates 79 and 81 is applied directly to NAND 91 and through an inverter 97 to NAND gate 89. The output of inverter 97 is also applied through an even number of inverters 99, 101, 103, 105, 107 and 109, to the second input of NAND gate 89. The signal applied to the second input of NAND input 89 is delayed by the total propagation time through the series connected inverters 99 through 109. In a similar manner, the signal selected by the transmission gates 79 and 81 is applied through an even number of inverters 97 through 107 which produce a total delay equal to the sum of their individual delays, to the second input of NAND 91. While the signals PHI1 and PHI2 go low essentially immediately with the signal selected by the transmission gate 79 and 81, they only go high after the time delay imposed by the series connected inverters. Thus, the signals PHI1 and PHI2 are non-overlapping as shown in FIG. 4. Depending upon the value of the HIGHPASS signal, the signals PHI1 and PHI2 will have a frequency of either 400 Hz or 51.2 KHz.

Figure 6:
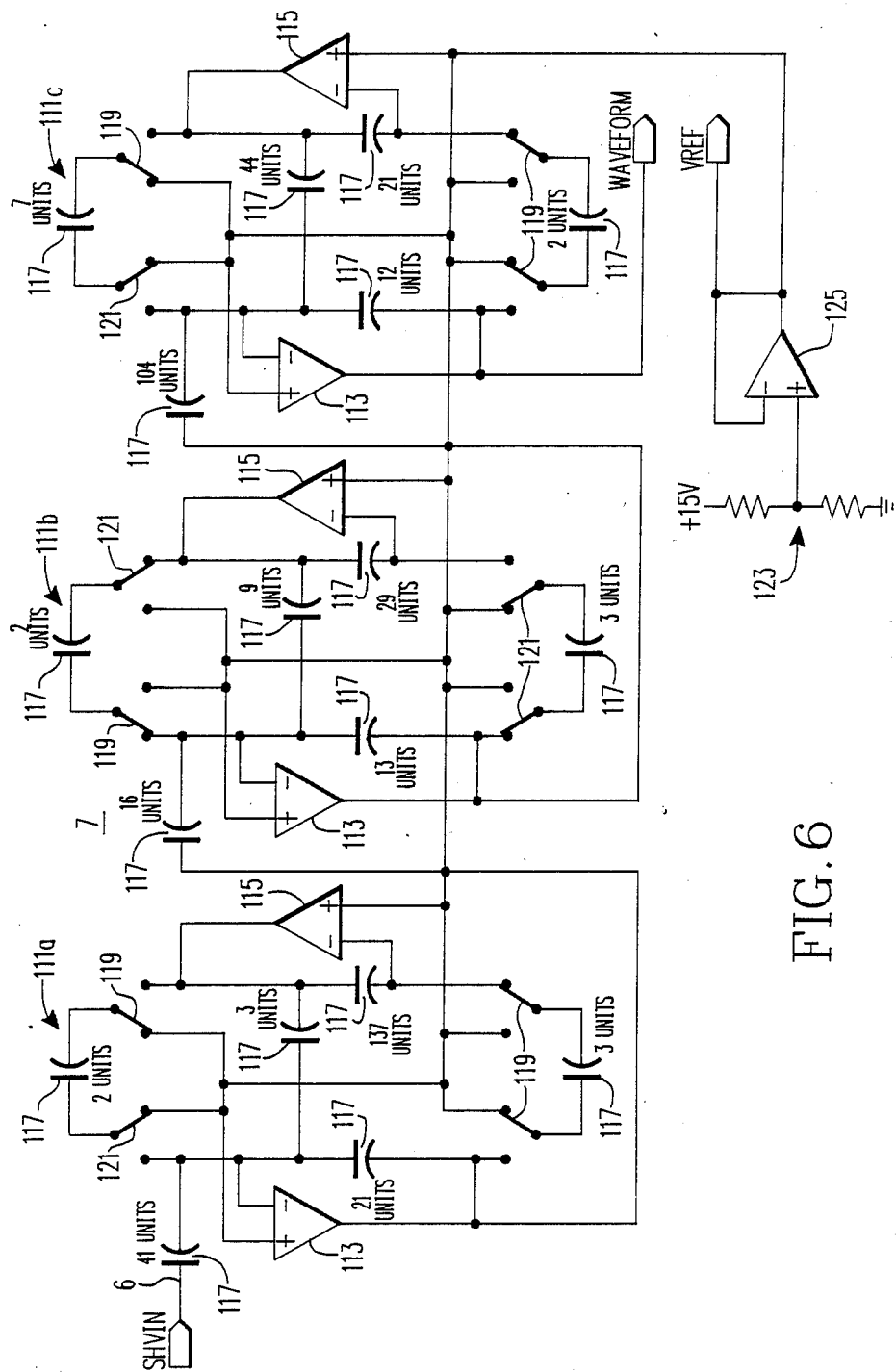
FIG. 6 is a schematic circuit diagram of a switched capacitor filter which forms part of the detector of FIG. 1.

FIG. 6 illustrates the switched capacitor filter 11 to which the SHVIN sample from the sample-and-hold circuit 5 is applied over lead 6. The exemplary filter 7 is a sixth-order Chebychev highpass filter comprising three cascaded two-pole filter stages 111a, 111b, and 111c. Each two-pole stage 111a, b and c includes a pair of operational amplifiers 113 and 115, a number of capacitors 117, and break before make switches 119 and 121. Switched capacitor filter circuits of this type have been described in "Designing Low Frequency Filters On The CMOS Monochip" by Ted W. Pickerrell, published by Interdesign Inc., 1983. Formulas for selecting the relative values of the capacitors for the first and second stages 111a and 111b of the switched capacitor highpass filter 7 are provided in the this publication. The relative values of the capacitors 117 for the third stage 111c of the filter can be similarly derived by those skilled in the art using the well-known Chebychev calculations. Relative values for the exemplary filter circuit are shown in FIG. 6. These relative values have been adjusted from the calculated Chebychev values to adjust the gains so the outputs of the two operational amplifiers 113 and 115 in each stage do not saturate. A six volt reference voltage, VREF for the filter circuit 7 is generated by a voltage divider 123 buffered by an operational amplifier 125. The filter circuit 7 uses the six volt reference voltage VREF as ground with outputs of increasing magnitude approaching zero volts.

Figure 7:
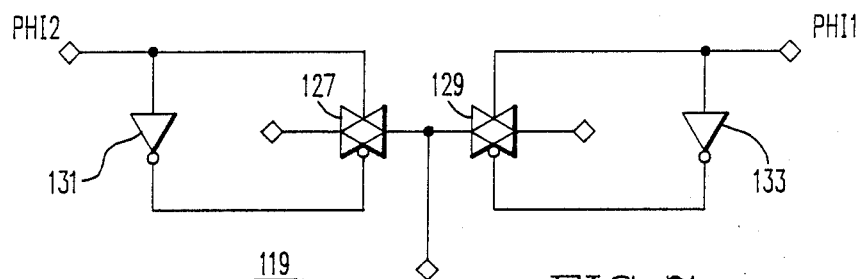
FIG. 7 is a schematic circuit diagram of one type of switch used in the switched capacitor filter of FIG. 6.
Figure 8:
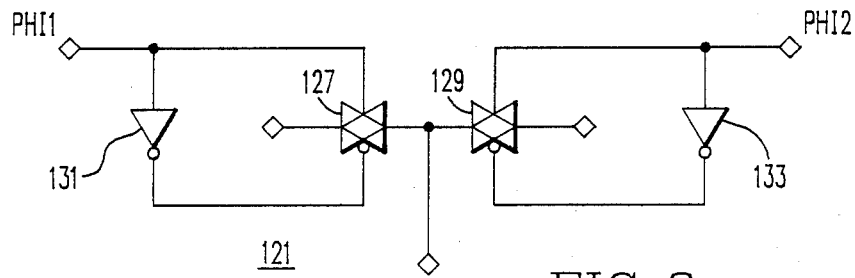
FIG. 8 is a schematic circuit diagram of another type of switch used in the switched capacitor filter of FIG. 6.

More detailed schematics of the break before make switches 119 and 121 are illustrated in FIGS. 7 and 8 respectively. Each of these switches comprises a pair of CMOS transmission gates 127 and 129 with their inverters 131 and 133 respectively for generating the complimentary control signals. The transmission gates 127 and 129 in two types of switches 119 and 121 are controlled by the non-overlapping clocking signals PHI1 and PHI2. However, PHI1 controls transmission gate 127 in switch 119 but transmission gate 129 in switch 121, while PHI2 controls the opposite transmission gates in the two types of switches.

Figure 9:
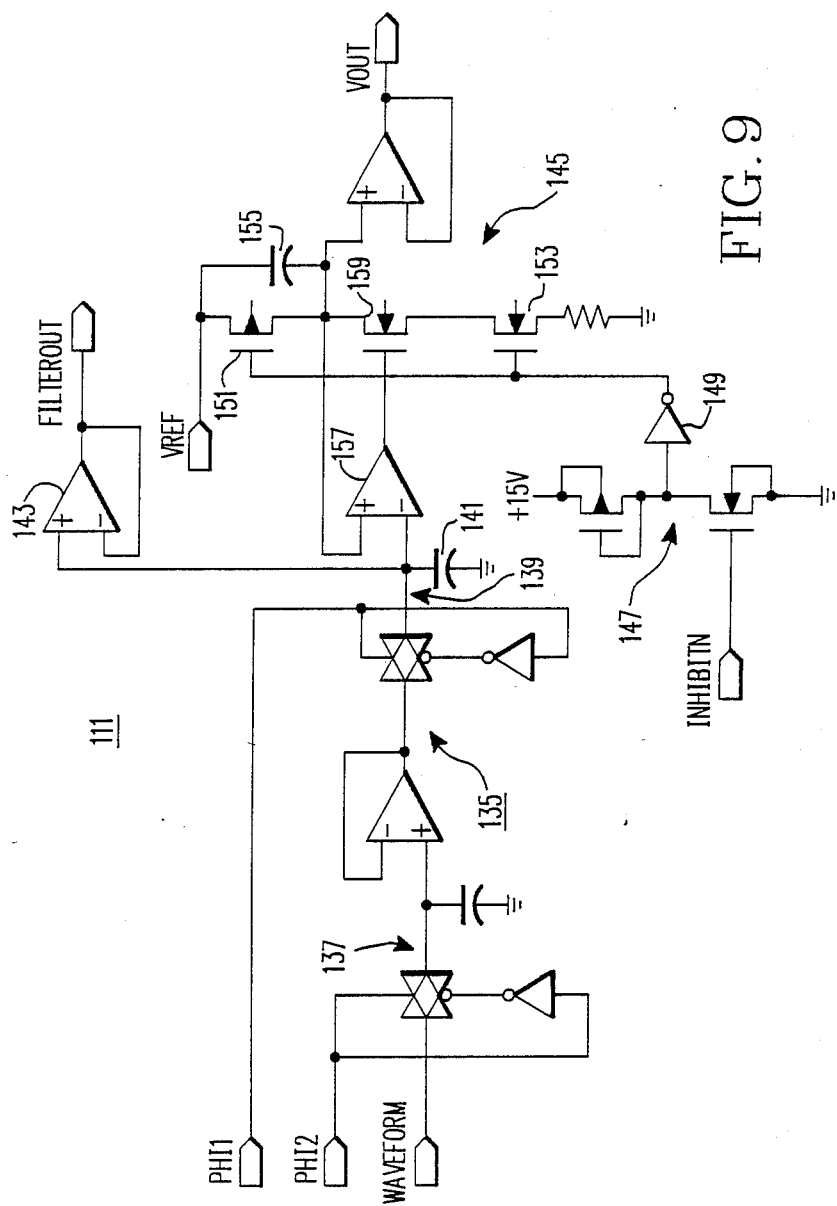
FIG. 9 is a schematic circuit diagram of a sample-and-hold and peak detection circuit which forms a part of the detector of FIG. 1.

The sample-and-hold and peak detection circuit 11 shown in detail in FIG. 9 includes a two-stage sample-and-hold circuit 135, similar to the circuit 5, which samples and holds the signal WAVEFORM generated by the discrete time analog filter 7. Contrary to the circuit 5, however, the first stage 137 of sample-and-hold circuit 135 is controlled by PHI2 and the second stage 139 is controlled by PHI1. The discrete time analog value of the filter signal WAVEFORM is stored on the capacitor 141 in the second stage 139 of the sample-and-hold circuit 135, and is provided through buffer amplifier 143 as the current discrete time output signal of the filter, FILTEROUT.

The circuit 11 also contains a peak detection circuit 145 which is controlled by a digital INHIBITN signal. INHIBITN is applied through a five to fifteen volt level shifter 147 and a pulse shaping inverter 149 to the gates of an N-channel and a P-channel FET 151 and 153 respectively. When INHIBITN is high, N-channel FET 151 is turned on to raise both terminals of a capacitor 155 to the reference voltage VREF. When INHIBITN goes low, FET 151 is turned off and P-channel FET 153 is turned on. The voltage on capacitor 155 is compared in comparator 157 with the current discrete time analog value of the signal generated by the filter circuit 7 stored in capacitor 141 and applied to the inverting input of comparator 157. If the voltage on capacitor 141 is less than the voltage on capacitor 155, indicating that the current amplitude of the frequencies detected by filter 7 exceeds the previous high value represented by the voltage on capacitor 155, the output of comparator 157 goes low to turn on a P-channel FET 159. With FET 153 also turned on by a low value of INHIBITN, charge is removed from capacitor 155 until the voltage on capacitor 155 becomes equal to the voltage on capacitor 141. Thus, the lower the voltage on capacitor 155 the higher the peak amplitude of the extraneous frequencies detected by the filter.

Figure 10:
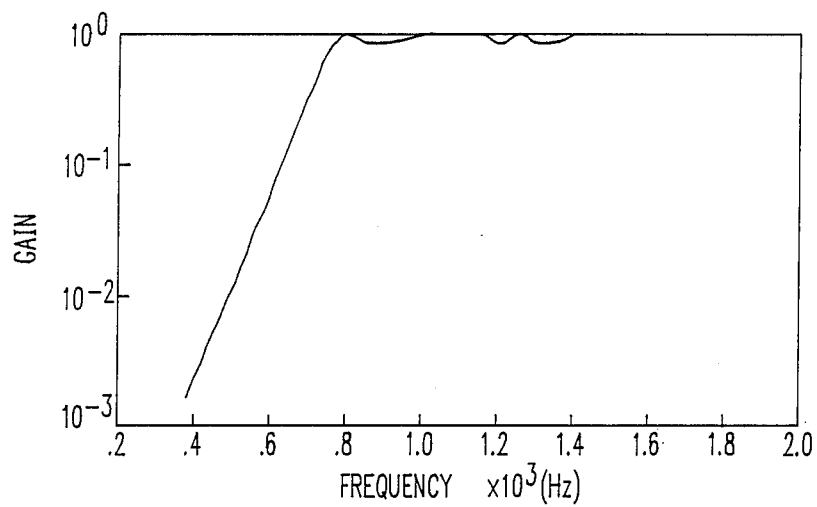
FIG. 10 is a diagram illustrating the filtering characteristic of the circuit of FIG. 1 in one mode of operation.

As mentioned, the extraneous frequency detector 1 can be operated in two modes. In a highpass filter mode, the HIGHPASS signal applied to the dual-phase non-overlapping clock generator 9 is high to turn on the transmission gate 79 so that the non-overlapping clocking signals PHI1 and PHI2 are generated at 51.2 KHz. With the sample-and-hold circuit 5 and the switched capacitor filter circuit 7 operated at 51.2 KHz by the signals PHI1 and PHI2, the filter 7 passes frequencies above 400 Hz with a corner frequency of about 800 Hz. The response of the filter 7 under these conditions is shown at FIG. 10. The current analog value of the filter output for frequencies above 400 Hz in this mode of operation is available as the FILTEROUT signal generated by the sample-and-hold and peak detection circuit 11. The peak value of the frequencies is available as VOUT.

Current and peak amplitudes for any phase of the monitored electrical signal can be generated. When the input signal is to be changed, the INHIBITN signal goes high to reset the capacitor 155. The appropriate values of SELA1 and SELA0 are then applied to the multiplexer 3 to select the desired input signal. The INHIBITN signal remains high until the filter settles down and then goes low to record the peak amplitude of the frequencies above 400 Hz passed by the filter 7.

Figure 11:
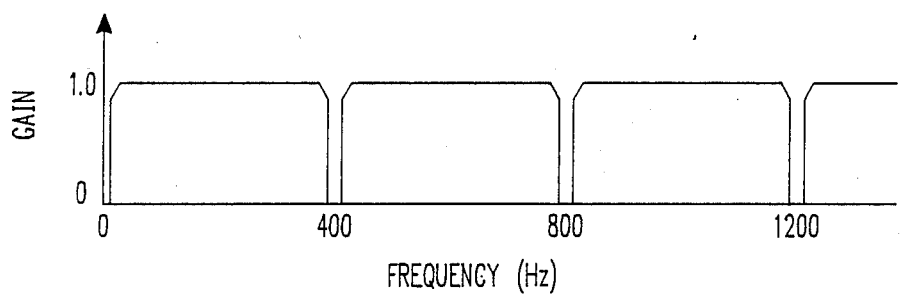
FIG. 11 is a diagram illustrating the filtering characteristics of the circuit of FIG. 1 in a second mode of operation.

In the second mode of operation, the HIGHPASS signal is set low to turn off transmission gate 79 and turn on gate 81 so that the PHI1 and PHI2 signals are generated at 400 Hz, the fundamental frequency of the electrical signal being analyzed. With VIN sampled at a rate of 400 Hz by the sample-and-hold circuit 5, the fundamental frequency appears as a dc signal which is eliminated by the high pass filter 7. The harmonics of the fundamental frequency also appear as dc signals and are similarly eliminated by the filter 7. This phenomenon, which results from sampling a signal at too low a sampling rate, is known as aliasing, which is generally considered undesirable in digital systems. However, I have determined that it can be used here as a comb filter to remove the fundamental frequency and its harmonics so that extraneous frequencies can be detected. The response of the filter circuit 7 when operated at 400 Hz is illustrated in FIG. 11. Since the switching frequency has been reduced by a factor of 128, the frequencies passed are also reduced by the same factor so that in this mode of operation, the filter passes frequencies above 3.125 Hz with a corner frequency of about 6.5 Hz. Thus, as shown in FIG. 11, the filter circuit 7 detects 100% of the frequencies above about 8 Hz except for the fundamental frequency and harmonics of the applied signal.

To avoid aliasing in the highpass mode of operation, the filter 7 should be operated at a rate at least twice the frequency of the desired frequency to be detected. Since it was desired in the exemplary detector to detect frequencies in the highpass mode of operation up to 20 KHz, 51.2 KHz was selected because it is also a convenient factor of a power of two times the fundamental frequency 400 Hz which simplifies construction of the divider in the dual-phase non-overlapping clock generator circuit 9.

The extraneous frequency detector of the invention is preferably implemented as an integrated circuit on a single chip. The exemplary system is implemented on a Universal 6003 Analog CMOS Array provided by Universal Semiconductor, Inc., San Jose, Calif. The external signals used as described above to operate the detector can be generated by a microprocessor associated with the VSCF generator with which the disclosed embodiment of the invention is intended to be used.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Apparatus for detecting extraneous frequencies in an electrical signal with a preset fundamental frequency, said apparatus comprising:
   sample-and-hold means for sampling and holding as an amplitude sample, the amplitude of said electrical signal at a selected sampling rate;
   a discrete time, analog, highpass filter including switching means;
   means applying said amplitude sample held by said sample-and-hold means to said discrete time analog highpass filter;
   control means controlling the sampling rate of said sample-and-hold means and the switch means of said discrete time analog, highpass filter, and including means to set the sampling rate of the sample-and-hold means and to switch the switching means of said discrete time analog highpass filter at said fundamental frequency to alias the fundamental frequency and harmonics thereof; and
   output means generating an output signal representative of the amplitude of frequencies passed by said highpass filter.

2. The apparatus of claim 1 wherein said:
   discrete time analog highpass filter comprises a switched capacitor highpass filter having first and second switching means;
   said sample-and-hold means includes first and second sample-and-hold stages serially connected; and
   said control means includes non-overlapping clock signal generator means generating dual-phase non-overlapping clocking signals, said first sample-and-hold stage and said first switching means being responsive to a first of said dual-phase non-overlapping clocking signals, and the second sample-and-hold stage and the second switching means being responsive to the second of said dual-phase non-overlapping clocking signals.

3. The apparatus of claim 2 wherein said switched capacitor highpass filter comprises at least two cascaded two-pole switched capacitor filter stages.

4. The apparatus of claim 3 wherein said switched capacitor highpass filter comprises three cascaded two-pole switched capacitor filters stages.

5. The apparatus of claim 1 wherein said control means includes means to alternatively set the sampling rate of said sample-and-hold means and the rate of switching of said switching means in said discrete time analog highpass filter to a selected frequency equal to at least twice a selected harmonic of said fundamental frequency.

6. The apparatus of claim 5 wherein said selected frequency is a selected multiple of said fundamental frequency and wherein said means in said control means for setting the sampling rate and the switching rate at said selected frequency includes means generating control signals having said selected frequency and where said means setting said sampling rate and switching rate to said fundamental frequency include means dividing the selected frequency of said control signals by said selected multiple.

7. The apparatus of claim 6 wherein said selected multiple is a power of 2, and wherein said dividing means includes a plurality of flip-flops connected to perform said division by said selected power of 2.

8. The apparatus of claim 6 wherein said output means includes means for detecting and storing a peak value of the amplitude of the frequencies passed by said highpass filter.

9. Apparatus for detecting extraneous frequencies in a multiphase electrical signal with a preset fundamental frequency generated by a multiphase variable speed constant frequency generator, said apparatus comprising:
- a multiplexer controllably selecting a phase of said multiphase electrical signal;
- a two-stage sample-and-hold circuit for sampling the selected phase of said multiphase electrical signal and passing from the first stage to the second stage an amplitude sample in response to dual-phase non-overlapping clocking signals;
- a switched capacitor highpass filter having first and second sets of switches responsive to dual-phase non-overlapping clocking signals;
- means applying said amplitude sample in the second stage of said two-stage sample-and-hold circuit to said switched capacitor highpass filter;
- control means generating said dual-phase non-overlapping clocking signals including means generating said clocking signals having said preset fundamental frequency, such that said switched capacitor highpass filter aliases said preset fundamental frequency and harmonics thereof in the selected phase of the electrical signal; and
- output means generating an output signal representative of the amplitude of frequencies passed by said highpass filter.

10. The apparatus of claim 9 wherein said control means includes means alternately generating dual-phase non-overlapping clocking signals at a frequency at least equal to twice a selected harmonic of said fundamental frequency.

11. The apparatus of claim 10 wherein said selected frequency is a power of 2 multiple of the fundamental frequency and wherein said control means includes means for dividing the frequency of the dual-phase non-overlapping clocking signals by said selected power of 2 to generate said dual-phase non-overlapping clocking signals having said preset fundamental frequency.

12. The apparatus of claim 11 wherein said switched capacitor highpass filter comprises at least two cascaded two-pole highpass filter stages.

13. The apparatus of claim 12 wherein said switched capacitor highpass filter comprises cascaded second order, fourth order and sixth order, two-pole switched capacitor highpass filter stages.

14. The apparatus of claim 10 wherein said output means includes means for detecting and storing the peak value of the output of said switched capacitor highpass filter.

* * * * *